(12) United States Patent
Lin et al.

(10) Patent No.: US 7,683,374 B2
(45) Date of Patent: Mar. 23, 2010

(54) SILICON BASED PHOTODETECTOR

(75) Inventors: Cha-Hsin Lin, Tainan (TW);
Lurng-Shehng Lee, Hsinchu County (TW); Ching-Chiun Wang, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 502 days.

(21) Appl. No.: 11/288,900

(22) Filed: Nov. 29, 2005

(65) Prior Publication Data

US 2007/0122934 A1   May 31, 2007

(51) Int. Cl.
*H01L 27/108* (2006.01)
*H01L 29/04* (2006.01)
*H01L 29/76* (2006.01)
*H01L 31/062* (2006.01)
*H01L 31/113* (2006.01)

(52) U.S. Cl. .................. 257/69; 257/293; 257/431; 257/79

(58) Field of Classification Search .................. 257/79, 257/431, 136, 130, 170, 129, 171, 153, 260, 257/266, 156, 69, 293, 292, 444, 462
See application file for complete search history.

(56) References Cited

U.S. PATENT DOCUMENTS

| | | | | |
|---|---|---|---|---|
| 5,525,828 | A * | 6/1996 | Bassous et al. | 257/457 |
| 6,570,186 | B1 * | 5/2003 | Uemura et al. | 257/79 |
| 6,774,448 | B1 * | 8/2004 | Lindemann et al. | 257/443 |
| 6,903,432 | B2 | 6/2005 | Reshotko et al. | |
| 7,033,910 | B2 * | 4/2006 | Faris | 438/455 |
| 7,078,257 | B2 * | 7/2006 | Sakamoto et al. | 438/46 |
| 7,084,471 | B2 * | 8/2006 | Reshotko et al. | 257/428 |

FOREIGN PATENT DOCUMENTS

JP    2004-105590    * 10/2005

* cited by examiner

*Primary Examiner*—Chuong A. Luu
(74) *Attorney, Agent, or Firm*—Alston & Bird LLP

(57) ABSTRACT

A method of fabricating a photodetector device includes preparing a silicon substrate, forming a patterned mesa on the silicon substrate, and forming a patterned conductive layer over the patterned mesa.

13 Claims, 12 Drawing Sheets

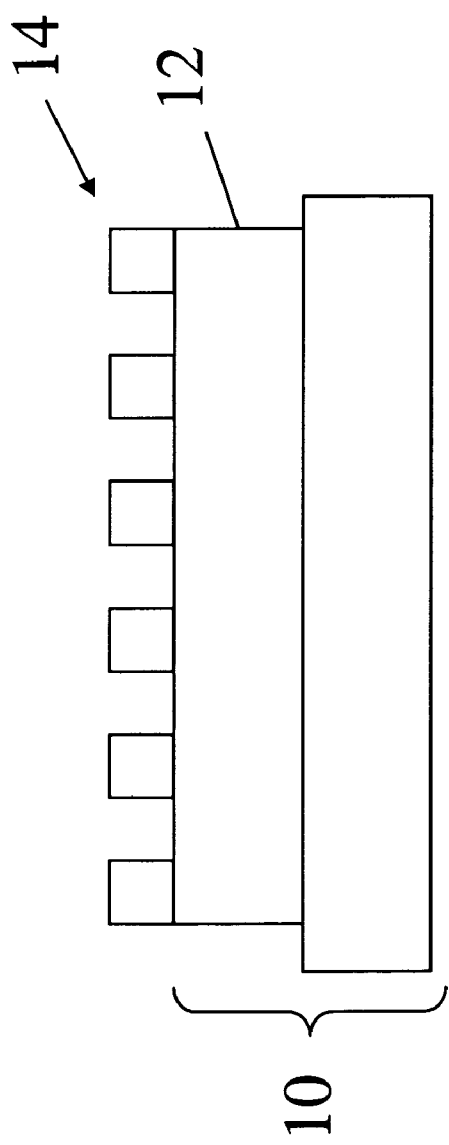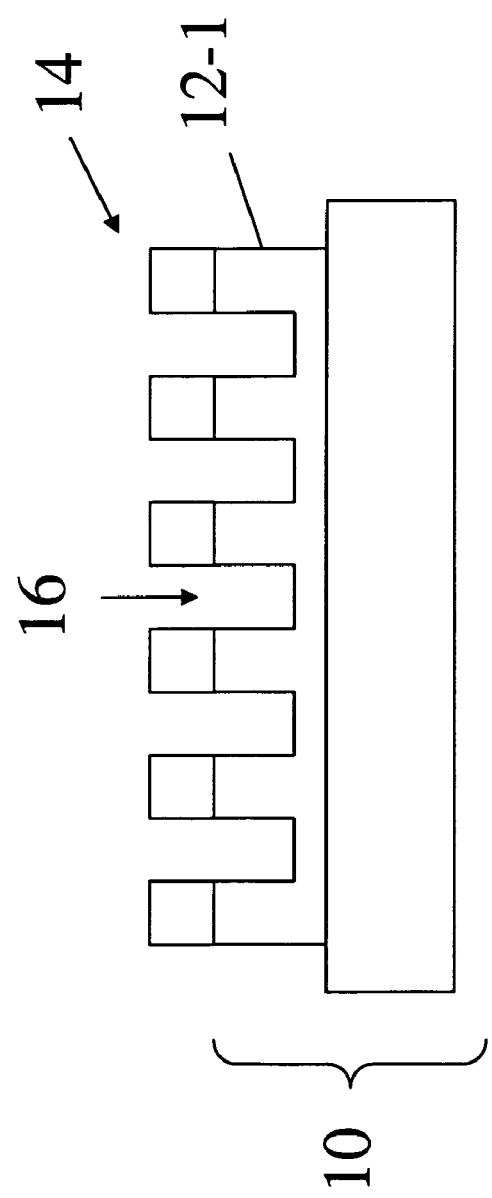

SILICON BASED PHOTODETECTOR

BACKGROUND OF THE INVENTION

The present invention generally relates to optical communication and, more particularly, to a photodetector device and a method of fabricating the same.

Digital modulation is generally used to transmit large amounts of data such as audio, video, voice, graphical and other media. The use of digital modulation requires a reliable and rapid data carrier means. The Internet, over which large amounts of information is now transmitted, has proven to be a cost effective and ubiquitous medium for data transmission. At its inception, the Internet was based on telephonic communications, which were in turn based on wire connections and electrical switching. The great amount of digital data used by multi-media has required the use of higher capability and higher speed transmission media. Optical fiber cable has proven to be an ideal backbone for the Internet because it has a large bandwidth and may carry much more data than wire/cable. Furthermore, optical fibers are low cost, flexible and are not sensitive to electromagnetic interference EMI.

There are many electro-optical applications, such as optical telecommunications and chip interconnects, that involve transmitting optical signals and converting the optical signals to electrical signals at high data rates. Generally, an optical source, i.e. transmitter, converts an electrical signal, either digital or analog, to a modulated light beam which is then passed through an optical fiber to an optical detector, i.e. receiver, that extracts an electrical signal from the received light beam. In today's rapidly advancing optoelectronics industry, vertical cavity surface emitting lasers ("VCSELs") are preferred as optical sources, which may typically emit light having a wavelength of 850 nm (nanometer), 1310 nm, 1550 nm or other wavelengths. The systems available for performing such transmission and conversion usually require a photodetector compatible with the speed and bandwidth of the optical signal. The typical photodetectors are III-V family PIN (p-type/intrinsic semiconductor material/n-type) semiconductor detectors. A photodetector is capable of detecting light emitted by the VCSEL.

Optical sources that emit light having a wavelength of 850 nm are generally used in short-haul applications such as short range links in a metropolitan area. For an infrared optical source having a wavelength of approximately 850 nm, light emitted therefrom may reach down to 16.7 µm (micrometer) in depth into a silicon substrate. A conventional photodetector device where electrodes are formed on a substrate surface may not effectively absorb photo-generated carriers, in particularly those generated in a deeper region of the substrate. As a result, when a light pulse occurs, photo-generated carriers not absorbed are in a drift state, disadvantageously resulting in a lower optical current and a smaller bandwidth. Furthermore, photo-generated carriers in the drift state may cause the photodetector device to incorrectly detect the logical level, i.e., 0 or 1 of an optical signal. To avoid the risk of incorrect detection, high density light signal pulses may not be accepted, which potentially aggravates the entire system speed.

BRIEF SUMMARY OF THE INVENTION

The present invention is directed to a semiconductor photodetector device and a method of fabricating the same that obviate one or more problems resulting from the limitations and disadvantages of the prior art.

In accordance with an embodiment of the present invention, there is provided a method of fabricating a photodetector device that comprises preparing a silicon substrate, forming a patterned mesa on the silicon substrate, and forming a patterned conductive layer over the patterned mesa.

Also in accordance with another embodiment of the present invention, there is provided a method of fabricating a photodetector device that comprises preparing a silicon substrate, etching the silicon substrate to form a silicon mesa, forming a patterned dielectric layer on the silicon mesa, anisotropically etching the silicon mesa by using the patterned dielectric layer as a mask to form a patterned silicon mesa including protrusions and trenches, etching the patterned silicon mesa in an orientation dependent etching ("ODE") process to form the trenches with sloped sidewalls, removing the patterned dielectric layer, and forming a patterned conductive layer over the patterned silicon mesa.

Further in accordance with another embodiment of the present invention, there is provided a method of fabricating a photodetector device that comprises preparing a silicon substrate, forming a patterned dielectric layer on the silicon substrate, anisotropically etching the silicon substrate by using the patterned dielectric layer as a mask to form a patterned silicon substrate, removing the patterned dielectric layer, and forming a patterned conductive layer over the patterned silicon substrate.

Still in accordance with the present invention, there is provided a semiconductor photodetector device that comprises a silicon substrate including a base, a first electrode formed on the silicon substrate, a second electrode formed on the silicon substrate, a mesa raised from the base of the silicon substrate being disposed between the first electrode and the second electrode, a first conductive region formed over the mesa electrically connected to the first electrode, and a second conductive region formed over the mesa electrically connected to the second electrode and separated apart from the first conductive region.

Yet still in accordance with another embodiment of the present invention, there is provided a semiconductor photodetector device that comprises a silicon substrate, an active region defined on the silicon substrate, a first electrode formed on the silicon substrate, a second electrode formed on the silicon substrate separated from the first electrode by the active region, a first conductive region formed in the active region electrically connected to the first electrode, and a second conductive region formed in the active region electrically connected to the second electrode, wherein the first conductive region and the second conductive region each include one or more trenches formed into the silicon substrate, the trenches having sloped sidewalls.

BRIEF DESCRIPTION OF THE SEVERAL VIEWS OF THE DRAWINGS

The foregoing summary as well as the following detailed description of the preferred embodiments of the present invention will be better understood when read in conjunction with the appended drawings. For the purposes of illustrating the invention, there are shown in the drawings embodiments which are presently preferred. It is understood, however, that the invention is not limited to the precise arrangements and instrumentalities shown. In the drawings:

FIGS. 1A to 1F are schematic diagrams illustrating a method of fabricating a photodetector in accordance with one embodiment of the present invention;

DETAILED DESCRIPTION OF THE INVENTION

Figure 1A:
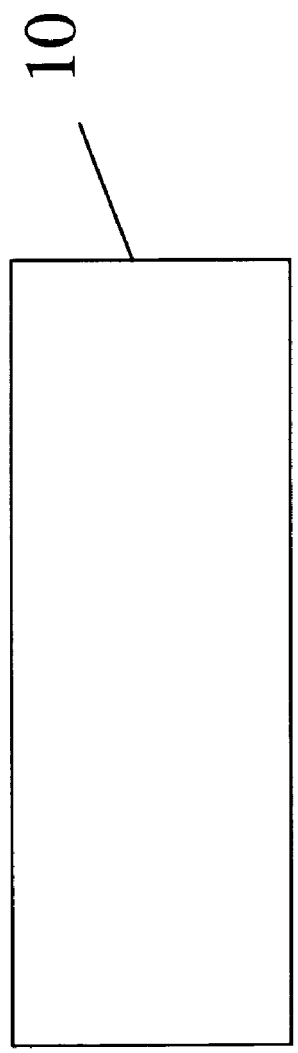
Figure 1B:
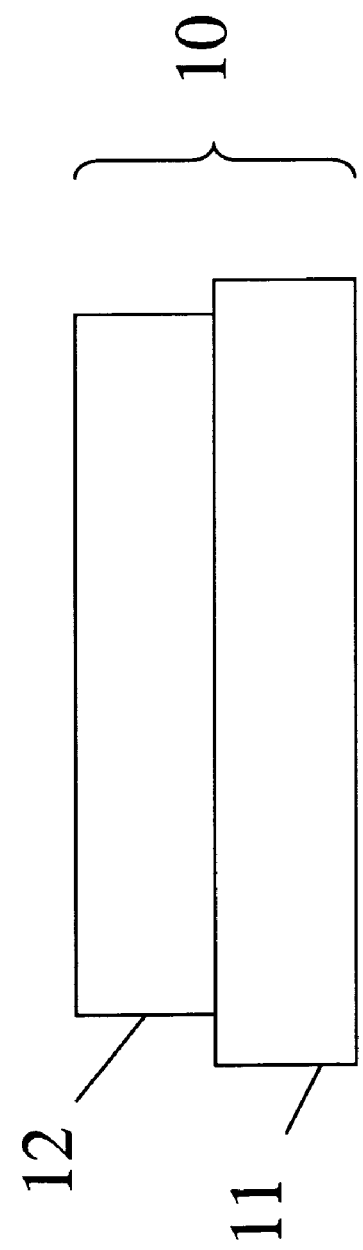

FIGS. 1A to 1F are schematic diagrams illustrating a method of fabricating a photodetector in accordance with one embodiment of the present invention. Referring to FIG. 1A, a silicon substrate 10 is provided. The thickness of silicon substrate 10 ranges from approximately 700 μm (micrometer) to 750 μm for an 8-inch wafer but the thickness could vary in particular applications. Referring to FIG. 1B, silicon substrate 10 is etched by, for example, a conventional patterning and etching process to form a mesa 12 raised from a base 11 of the silicon substrate 10. The thickness of mesa 12 ranges from approximately 0.1 μm to 20 μm but the thickness could vary in particular applications. Next, referring to FIG. 1C, a patterned dielectric layer 14 is formed on mesa 12 by, for example, a chemical vapor deposition ("CVD") process followed by a conventional patterning and etching process. The material of patterned dielectric layer 14 is selected from one of silicon oxide such as $SiO_2$, silicon nitride such as $Si_3N_4$, TEOS (tetraethylorthosilicate), BPSG (boron and phosphorus doped silicate glass), PSG (phosphorous-doped silicate-glass) or other material which exhibits a desired etch selectivity to silicon. The thickness of patterned dielectric layer 14 ranges from approximately 0.1 μm to 2 μm but the thickness could vary in particular applications.

Figure 1E:
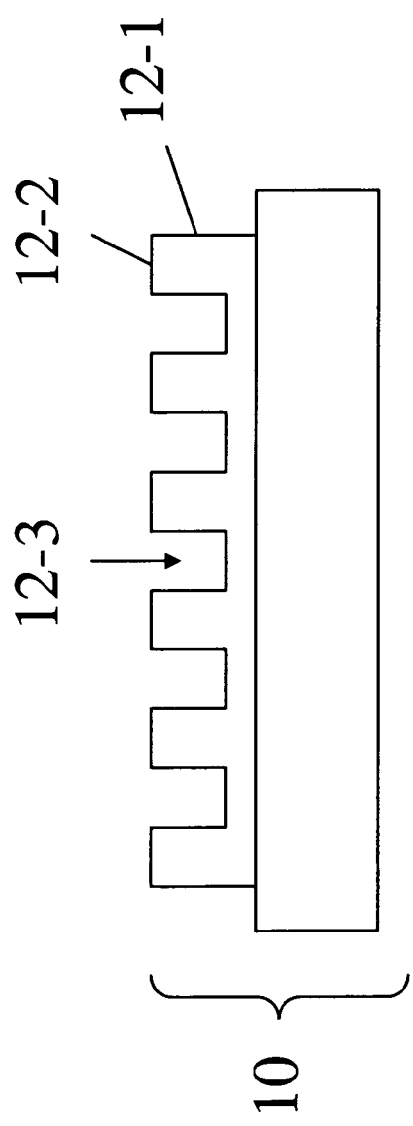

Referring to FIG. 1D, mesa 12 is etched in an anisotropic etching process by using patterned dielectric layer 14 as a mask, resulting in a patterned mesa 12-1 as illustrated in FIG. 1E. Referring to FIG. 1E, after patterned dielectric layer 14 is removed, patterned mesa 12-1 includes protrusions 12-2 and trenches 12-3 interleaved with the protrusions 12-2. The depth of trenches 12-3 ranges from approximately 1 μm to 17 μm. Due to the anisotropic etch, the sidewalls (not numbered) of protrusions 12-2 or trenches 12-3 are substantially perpendicular to the silicon substrate 10. In conducting the anisotropic etch, a conventional dry etch process using RF energy and gas phase chemicals or a wet etch process using liquid chemicals such as acids, bases and solvents or some other known etching process may be used.

Figure 1F:
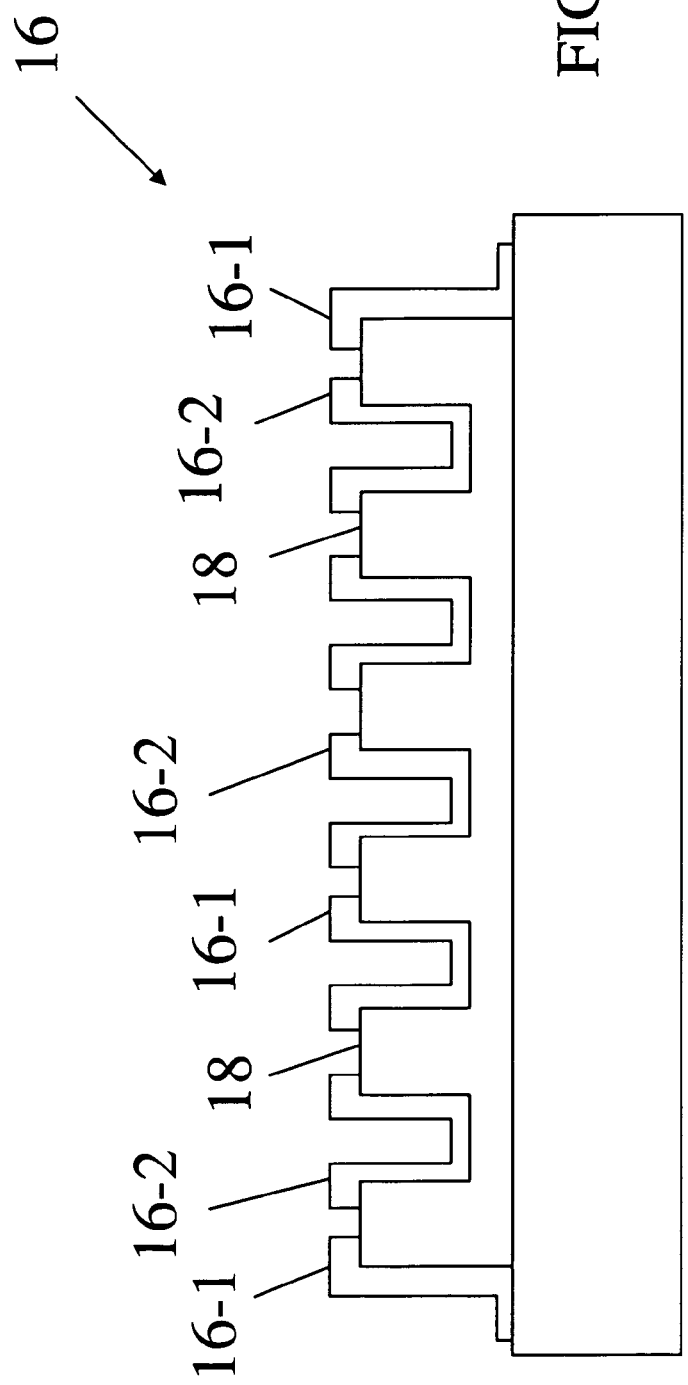

Next, referring to FIG. 1F, a patterned conductive layer 16 is formed on patterned mesa 12-1 by, for example, a conventional CVD or sputtering or some other suitable process followed by a patterning and etching or other suitable process, exposing a region 18 of a top surface (not numbered) of each of protrusions 12-2. Patterned conductive layer 16 includes a plurality of first conductive layers 16-1 and a plurality of second conductive layers 16-2 interleaved with but separated from first conductive layers 16-1. Each of first conductive layers 16-1 is electrically connected together to a first conductive pad, which serves as a first electrode, for example, an anode for the photodetector device in fabrication. Each of second conductive layers 16-2 is electrically connected together to a second conductive pad, which serves as a second electrode, for example, a cathode for the photodetector device. Exposed regions 18 function as the light receiving windows of the photodetector device. Suitable material for patterned conductive layer 16 includes one of chromium (Cr), aluminum (Al), platinum (Pt) or indium tin oxide ("ITO") or other suitable materials. The thickness of patterned conductive layer 16 ranges approximately from 50 nm (nanometer) to 500 nm but may vary in particular applications.

Figure 2A:
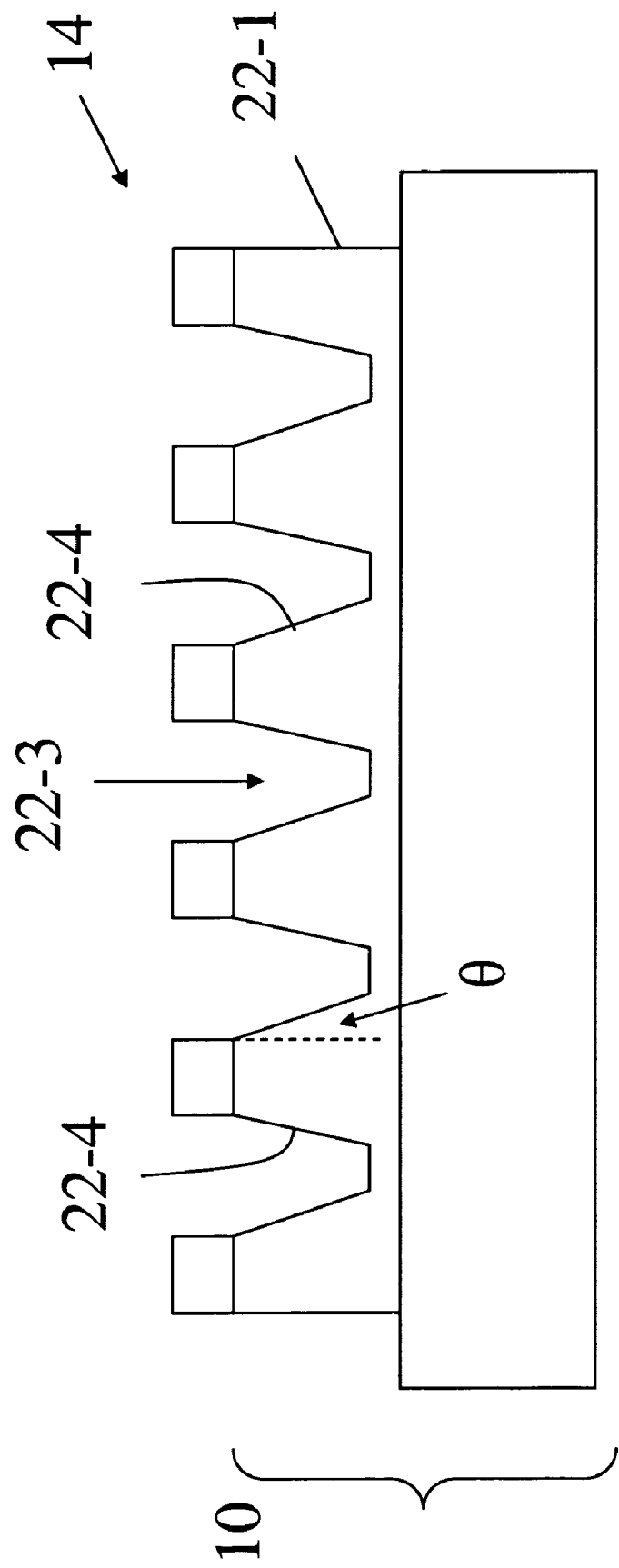
FIGS. 2A and 2B are schematic diagrams illustrating a method of fabricating a photodetector in accordance with another embodiment of the present invention.
Figure 2B:
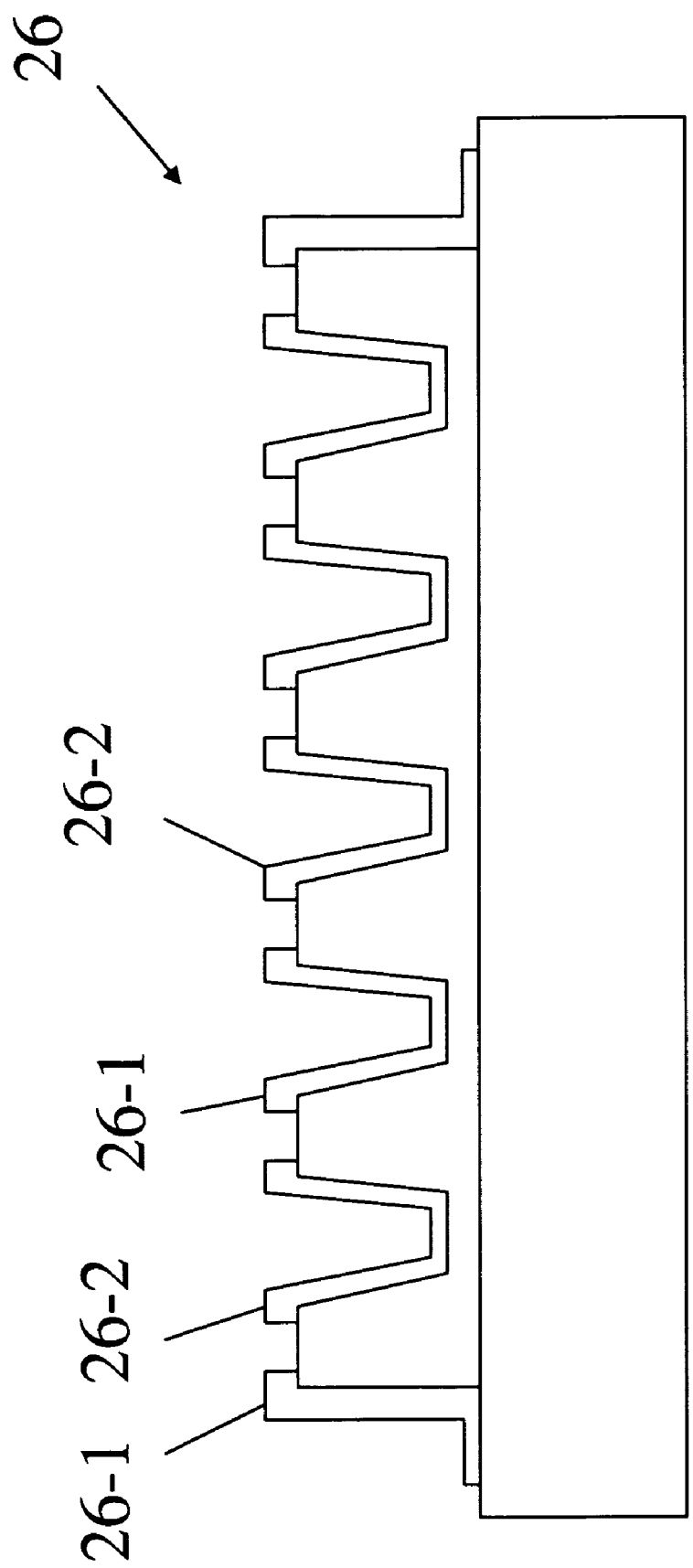

FIGS. 2A and 2B are schematic diagrams illustrating a method of fabricating a photodetector in accordance with another embodiment of the present invention. The method illustrated in FIGS. 2A and 2B includes substantially the same steps illustrated in FIGS. 1A to 1D. After the step of etching mesa 12 as illustrated in FIG. 1E, another anisotropic etching process called orientation dependent etching ("ODE") is conducted using patterned dielectric layer 14 as a mask to form trenches 22-3 with sloped sidewalls 22-4 in a patterned mesa 22-1. An angle θ of sloped sidewalls 22-4 with respect to a normal direction of the silicon substrate 10 ranges from approximately 10° to 80° but could be some other angle. In one aspect, the angle θ is approximately 54°. Etchants for the ODE include but are not limited to potassium hydroxide (KOH) in water, a mixture of potassium hydroxide and iso-propanol in water, a mixture of potassium hydroxide and aluminum in water, cesium hydroxide in water, hydrazine in water, rubidium hydroxide in water, and tetramethyl ammonium hydroxide (TMAH) in water. In the diamond lattice of silicon, generally the (111)-plane is more densely packed than the (100)-plane, and thus the etch rates of (111) orientated surfaces are expected to be lower than those of (100)-orientations. In one embodiment, an aqueous KOH is used as an etchant, which may etch approximately one hundred (100) times faster along (100)-planes than along (111)-planes.

Referring to FIG. 2B, a patterned conductive layer 26, which further includes a first conductive layer 26-1 and a second conductive layer 26-2, is formed on patterned mesa 22-1. As compared to the vertical sidewalls illustrated in FIG. 1D or 1E, sloped sidewalls 22-4 help reduce the risk of a discontinuous conductive layer in the trenches, which may otherwise occur in vertical sidewalls.

In another embodiment according to the present invention, a method of fabricating a photodetector device includes the steps illustrated in FIGS. 1A to 1C. Next, the step illustrated in FIG. 1D is eliminated and an ODE process is performed after the step of forming patterned dielectric layer 14 illustrated in FIG. 1C.

Figure 3A:
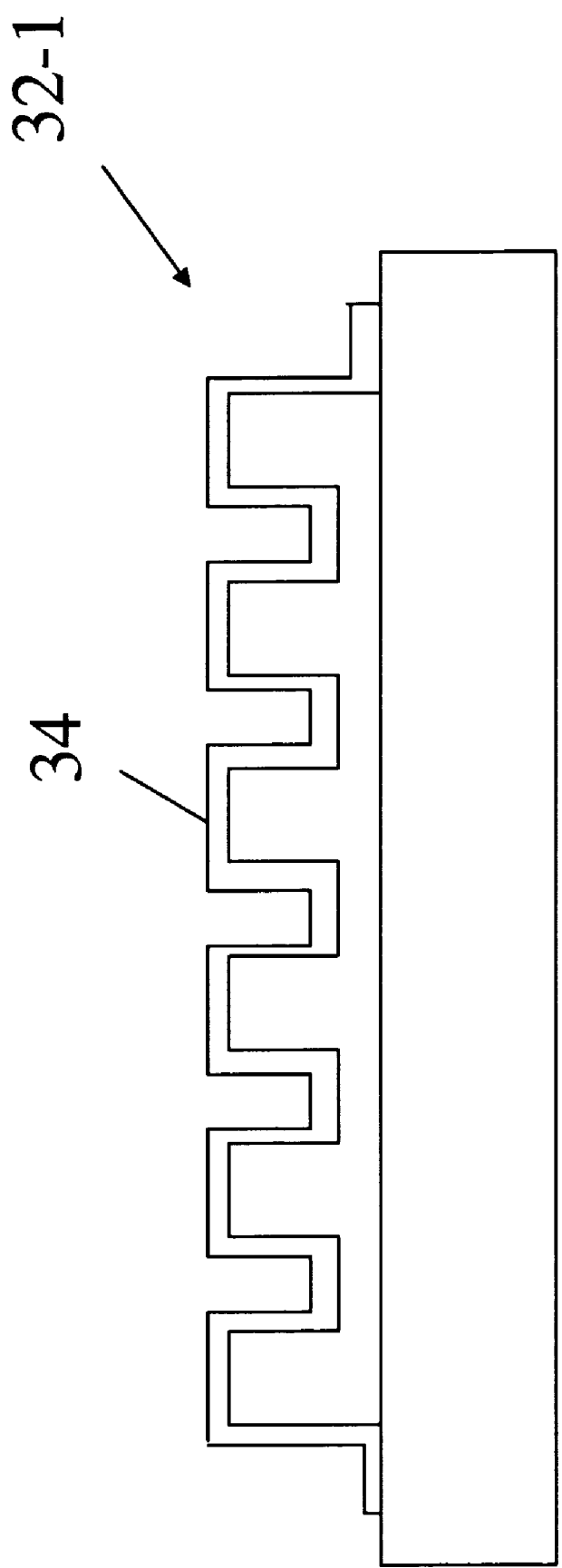
FIGS. 3A and 3B are schematic diagrams illustrating a method of fabricating a photodetector in accordance with still another embodiment of the present invention.
Figure 3B:
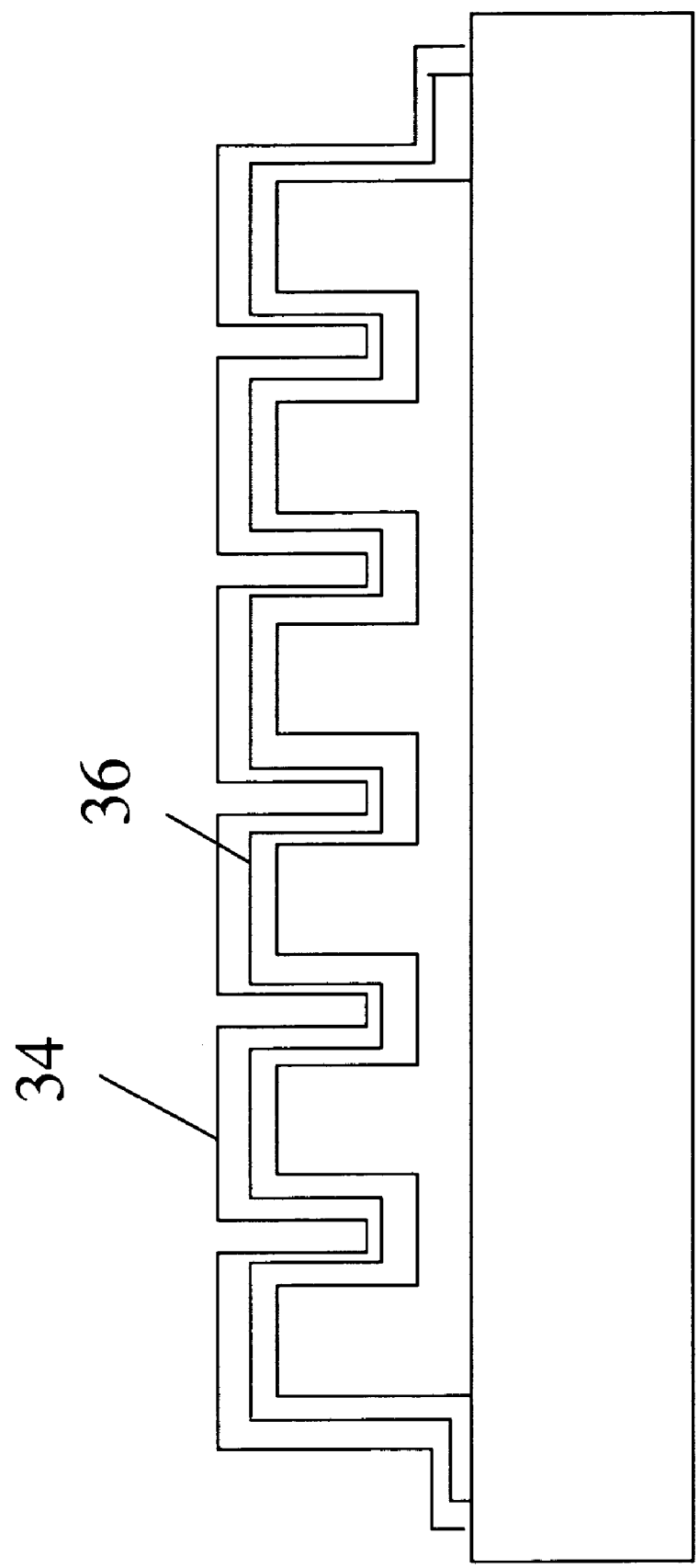

FIGS. 3A and 3B are schematic diagrams illustrating a method of fabricating a photodetector in accordance with still another embodiment of the present invention. Referring to FIG. 3A, an amorphous silicon layer 34 is formed on a patterned mesa 32-1 prior to forming a conductive layer. Amorphous layer 34 may increase Schottky barrier height in order to decrease a dark current. Suitable materials for amorphous silicon layer 34 include but are not limited to amorphous silicon, amorphous $Si_xGe_y$, and amorphous $Si_xC_y$. The thickness of amorphous silicon layer 34 is approximately in the range of approximately 0.1 nm to 500 nm but could vary in some applications.

Alternatively, referring to FIG. 3B, prior to forming a conductive layer, an oxide film 36 such as $SiO_2$ is formed on patterned mesa 32-1 by, for example, an annealing process at a temperature ranging from approximately 600° C. to 800° C. The thickness of oxide film 36 is approximately in the range of approximately 0.1 nm to 400 nm but could vary in some applications. In another embodiment, after oxide film 36 is formed, amorphous silicon film 34 is formed on oxide film 36.

Figure 4A:
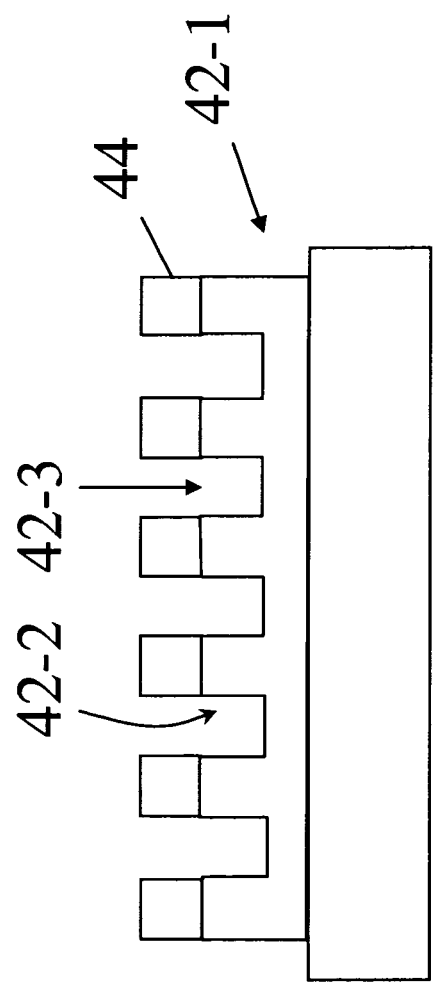
FIGS. 4A to 4D are schematic diagrams illustrating a method of fabricating a photodetector in accordance with yet another embodiment of the present invention.
Figure 4B:
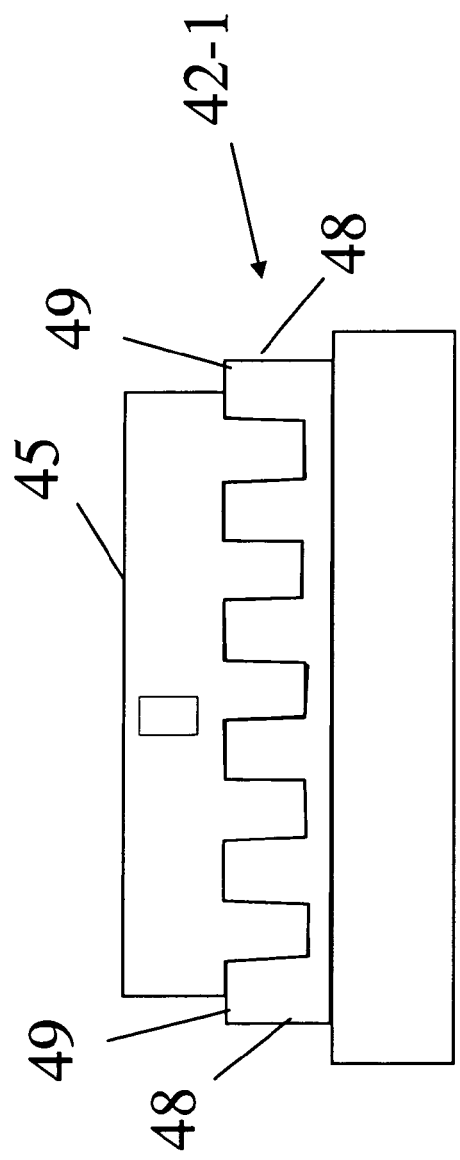
Figure 4C:
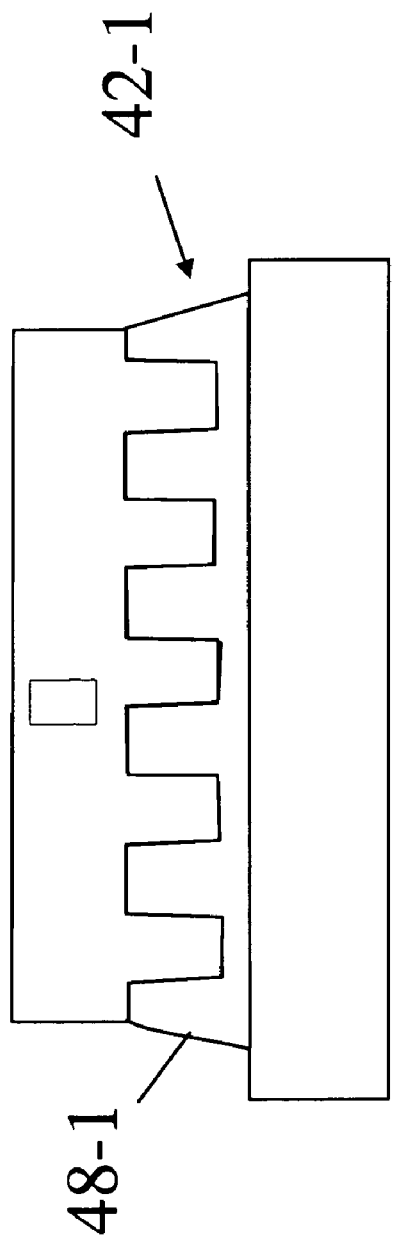
Figure 4D:
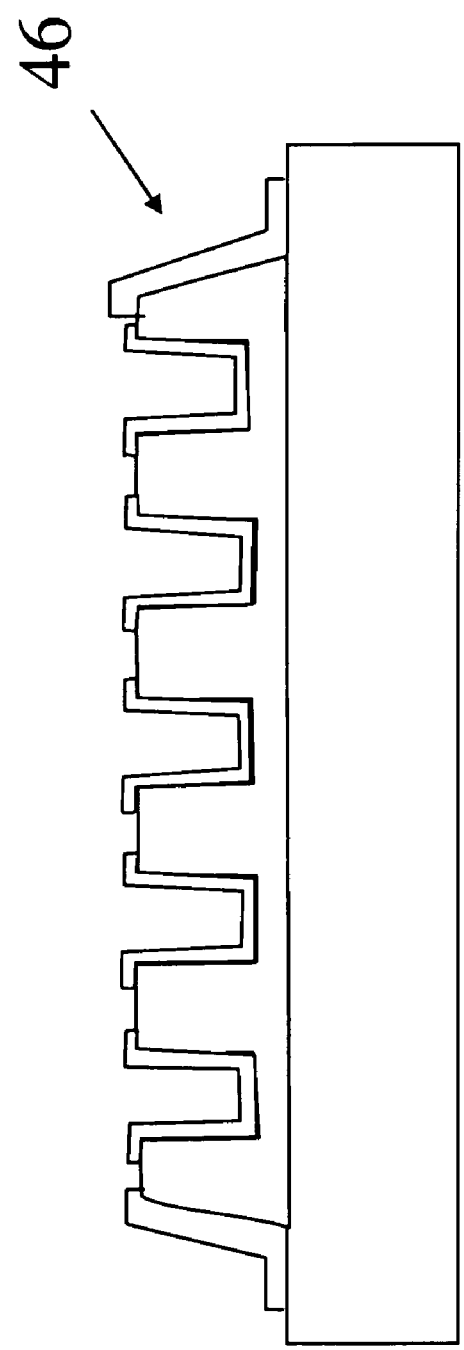

FIGS. 4A to 4D are schematic diagrams illustrating a method of fabricating a photodetector in accordance with yet another embodiment of the present invention. Referring to FIG. 4A, a patterned mesa 42-1 is formed by using a patterned dielectric layer 44 as a mask. Patterned mesa 42-1 includes protrusions 42-2 and trenches 42-3. Trenches 42-3 may include vertical sidewalls as in the present example or sloped sidewalls as previously described. Referring to FIG. 4B, after patterned dielectric layer 44 is removed, a photoresist layer 45 is formed on patterned mesa 42-1, which exposes at least an outer sidewall 48 and a portion of a top surface 49 of one of peripheral protrusions 42-2 connecting the at least one outer sidewall 48. Referring to FIG. 4C, patterned mesa 42-1 is etched in an etching process using photoresist layer 45 as a mask, resulting in a sloped sidewall 48-1. Referring to FIG. 4D, a patterned conductive layer 46 is formed on patterned mesa 42-1. Sloped sidewalls 48-1 of patterned mesa 42-1 helps reduce the risk of a discontinuous conductive layer in the peripheral sidewalls of patterned mesa 42-1.

In another embodiment according to the present invention, skilled persons in the art will understand that, prior to forming patterned conductive layer 46, an oxide film is formed on patterned mesa 42-1. In still another embodiment, prior to forming patterned conductive layer 46, an amorphous silicon layer is formed on patterned mesa 42-1. In yet another embodiment, an oxide film and then an amorphous silicon layer are formed on patterned mesa 42-1 prior to forming patterned conductive layer 46.

Figure 5A:
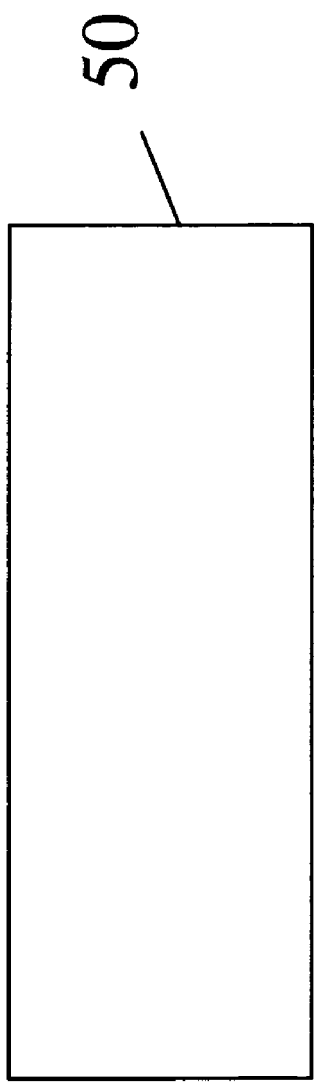
FIGS. 5A to 5D are schematic diagrams illustrating a method of fabricating a photodetector in accordance with yet still another embodiment of the present invention.
Figure 5B:
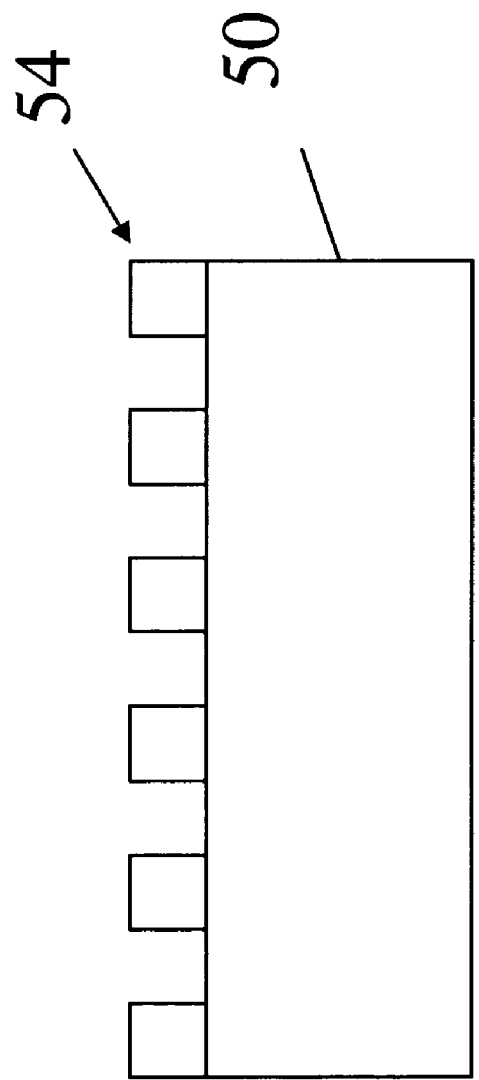
Figure 5C:
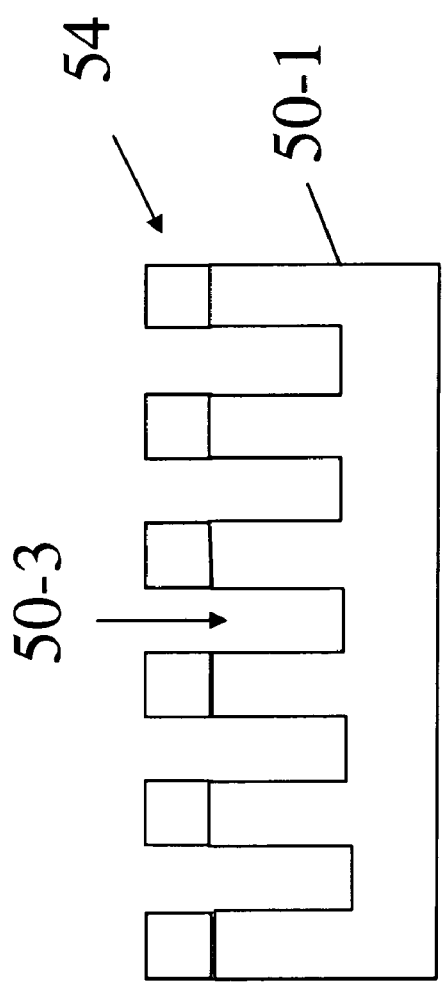

FIGS. 5A to 5D are schematic diagrams of a method of fabricating a photodetector in accordance with yet still another embodiment of the present invention. The method illustrated in FIGS. 5A to 5D is similar to that illustrated in FIG. 1A to 1F except that no mesa is formed. Referring to FIG. 5A, a silicon substrate 50 is provided. Next, referring to FIG. 5B, a patterned dielectric layer 54 is formed on silicon substrate 50. Referring to FIG. 5C, silicon substrate 50 is etched in an anisotropic etching process by using patterned dielectric layer 54 as a mask, resulting in a patterned silicon substrate 50-1 with trenches 50-3 formed therein. Trenches 50-3 may include vertical sidewalls as in the present example or sloped sidewalls as previously described. In one embodiment according to the present invention, the anisotropic etching process includes a conventional dry etch or wet etch to form trenches 50-3 with vertical sidewalls. In another embodiment, the anisotropic etching process is followed by another anisotropic etching process to form trenches 50-3 with sloped sidewalls. In still another embodiment, after patterned dielectric layer 54 is formed, an ODE process is conducted to form trenches 50-3 with sloped sidewalls.

Figure 5D:
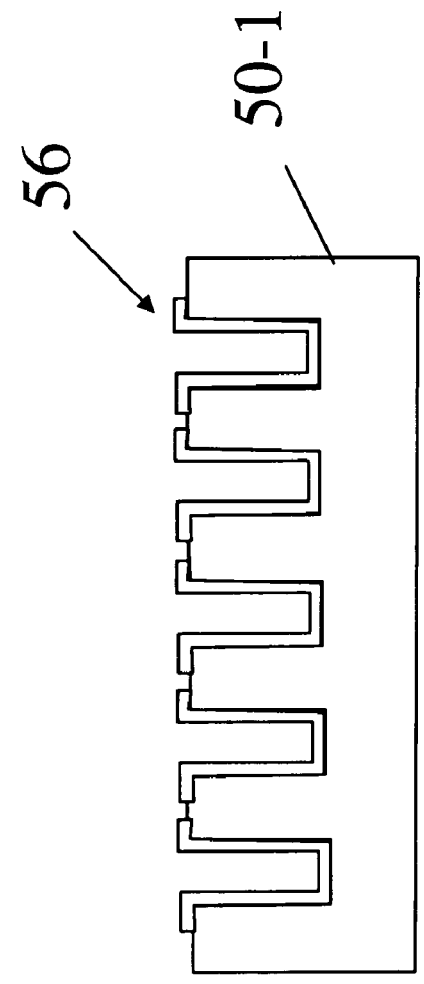

Referring to FIG. 5D, a patterned conductive layer 56 is formed on patterned silicon substrate 50-1. In one embodiment, prior to forming patterned conductive layer 56, patterned silicon substrate 50-1 is further etched in a conventional patterning and etching process to form sloped sidewalls. In still another embodiment, prior to forming patterned conductive layer 56, an oxide film is formed on patterned silicon substrate 50-1. In yet another embodiment, prior to forming patterned conductive layer 56, an amorphous silicon layer is formed on patterned silicon substrate 50-1. In yet still another embodiment, an oxide film and then an amorphous silicon layer are formed on patterned silicon substrate 50-1 prior to forming patterned conductive layer 56.

Figure 6:
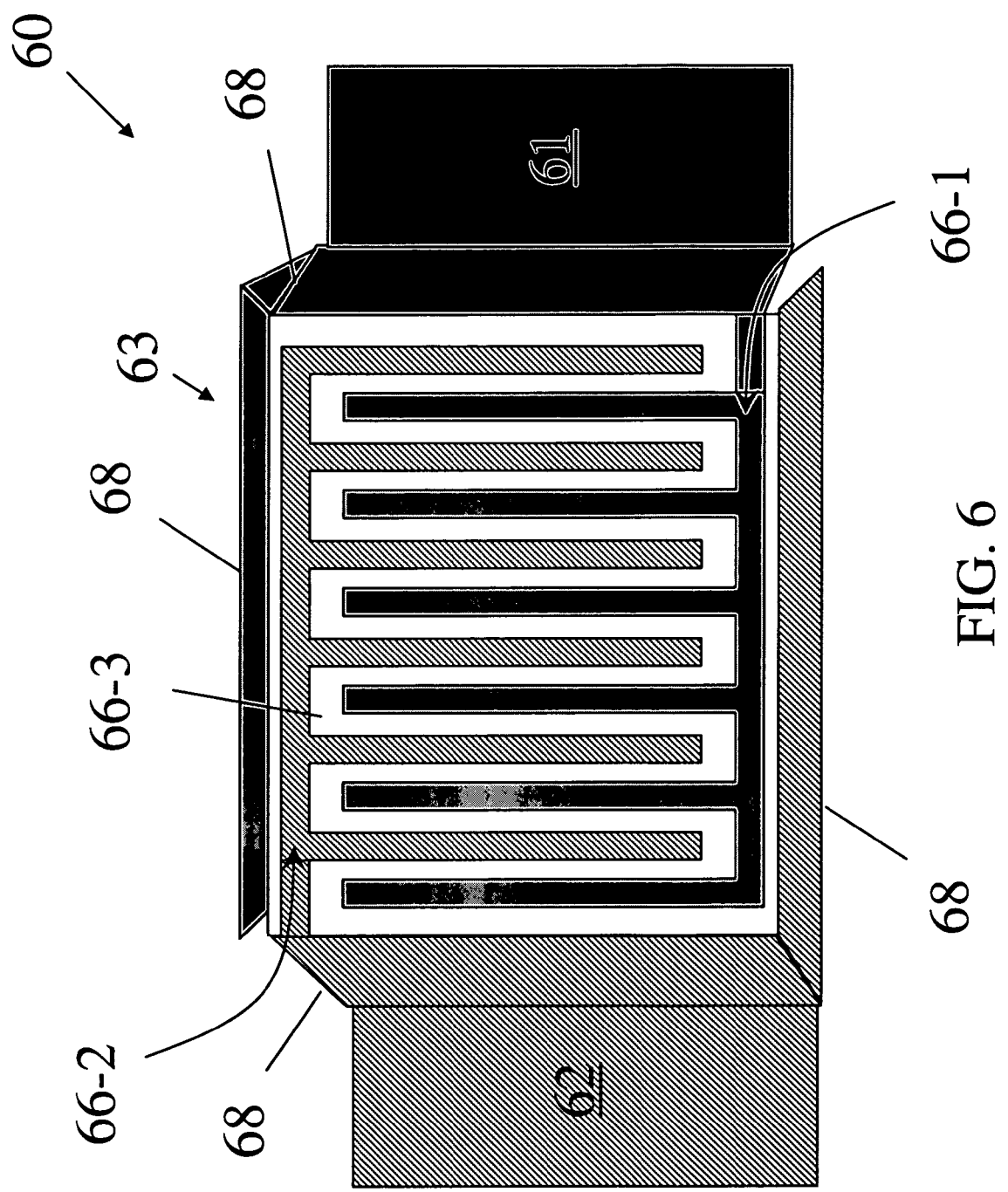
FIG. 6 is a top perspective view of a photodetector device in accordance with one embodiment of the present invention.

FIG. 6 is a top perspective view of a photodetector device 60 in accordance with one embodiment of the present invention. Referring to FIG. 6, photodetector device 60 includes a first electrode 61, a second electrode 62 and an active region 63. First electrode 61 and second electrode 62 function as an anode and a cathode respectively or vice versa of photodetector device 60. Active region 63 is formed on a silicon mesa (not numbered) disposed between first electrode 61 and second electrode 62. A patterned conductive layer (not numbered) formed in active region 63 includes first conductive layers 66-1 and second conductive layers 66-2 formed in an interdigitated pattern. Specifically, first conductive layers 66-1 and second conductive layers 66-2 are interleaved with one another but separated by light absorbing windows 66-3. In one embodiment, the silicon mesa, raised from a silicon substrate, includes sloped sidewalls 68. In another embodiment, active region 63 is formed in a silicon substrate, as described in the embodiments illustrated by reference to FIGS. 5A to 5D.

In describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of the disclosed steps in the order written, and one skilled in the art can readily appreciate that the sequences may be varied and still remain within the spirit and scope of the present invention.

It will be appreciated by those skilled in the art that changes could be made to the preferred embodiments described above without departing from the broad inventive concept thereof. It is understood, therefore, that this invention is not limited to the particular embodiments disclosed, but is intended to cover modifications within the spirit and scope of the present application as defined by the appended claims.

We claim:

1. A semiconductor photodetector device, comprising:
   a silicon substrate;
   a first electrode formed on the silicon substrate;
   a second electrode formed on the silicon substrate;
   a mesa raised from and formed from part of the silicon substrate being disposed between the first electrode and the second electrode;
   a first conductive region formed over the mesa electrically connected to the first electrode; and
   a second conductive region formed over the mesa electrically connected to the second electrode and separated apart from the first conductive region.

2. The device of claim 1, wherein the mesa includes at least one sloped sidewall.

3. The device of claim 1, wherein the first conductive region and the second conductive region include trenches having sloped sidewalls.

4. The device of claim 1, further comprising a light absorbing region formed between the first conductive region and the second conductive region.

5. The device of claim 1, further comprising an oxide film formed on the mesa.

6. The device of claim 1, further comprising an amorphous silicon layer formed on the mesa.

7. The device of claim 1, wherein the first conductive region and the second conductive region are disposed in an interdigitated pattern.

8. A semiconductor photodetector device, comprising:
   a silicon substrate;

an active region defined on the silicon substrate;

a first electrode formed on the silicon substrate;

a second electrode formed on the silicon substrate separated from the first electrode by the active region;

a first conductive region formed in the active region electrically connected to the first electrode; and a second conductive region formed in the active region electrically connected to the second electrode wherein the first conductive region and the second conductive region include one or more trenches formed into the silicon substrate having sloped sidewalls.

9. The device of claim 8, further comprising a light absorbing region formed in the active region.

10. The device of claim 8, further comprising an oxide film formed on the silicon substrate.

11. The device of claim 8, further comprising an amorphous silicon layer formed on the silicon substrate.

12. The device of claim 10, further comprising an amorphous silicon layer formed on the oxide film.

13. The device of claim 8, wherein the first conductive region and the second conductive region are disposed in an interdigitated pattern.

* * * * *